(12) United States Patent
Sogard (10) Patent No.: US 7,916,274 B2
(45) Date of Patent: Mar. 29, 2011

(54) MEASUREMENT OF EUV INTENSITY (75) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 684 days.

(21) Appl. No.: 11/588,643

(22) Filed: Oct. 27, 2006

(65) Prior Publication Data
US 2008/0151221 A1 Jun. 26, 2008

(51) Int. Cl.
G03B 27/58 (2006.01)
(52) U.S. Cl. ............................. 355/53; 355/63
(58) Field of Classification Search .................. 355/53, 355/55, 63, 67, 69, 71; 250/492.2, 492.22
See application file for complete search history.

(56) References Cited

U.S. PATENT DOCUMENTS 4,947,030 A * 8/1990 Takahashi .................. 250/201.1
6,842,500 B1 * 1/2005 Komatsuda et al. ............ 378/34
2003/0142410 A1 7/2003 Miyake
2003/0146391 A1 8/2003 Kleinschmidt et al.
2004/0227922 A1 11/2004 Dierichs et al.
2004/0239907 A1 12/2004 Hintersteiner et al.

FOREIGN PATENT DOCUMENTS
JP 2003-224053 8/2003
* cited by examiner

Primary Examiner — Edward J Glick
Assistant Examiner — Mesfin T Asfaw
(74) Attorney, Agent, or Firm — Finnegan, Henderson, Farabow, Garrett & Dunner LLP (57) ABSTRACT A monitoring system for an lithographic system that may be utilized in an extreme ultraviolet lithographic system is disclosed. In a monitoring system according to the present invention, a plurality of detectors are positioned to receive radiation from a pattern of positions on a mirror that is part of the lithographic system. In some embodiments, the plurality of detectors may be positioned on the mirror. In some embodiments, the plurality of detectors may be positioned behind the mirror and receive radiation through holes formed in the mirror. In some embodiments, radiation from the pattern of positions may be reflected by facets into the detectors.

35 Claims, 6 Drawing Sheets

FIG. 1

PRIOR ART

MEASUREMENT OF EUV INTENSITY

BACKGROUND

1. Field of the Invention

The present invention is related to the monitoring of radiation in a lithographic system and, in particular, to real time monitoring of radiation levels with minimal impact on radiation exposure within the lithographic system.

2. Background of the Invention

As the dimensions of semiconductor devices become smaller, so do the wavelengths of the radiation required in lithographic processes performed to deposit them. In order to efficiently print patterns of dimension 0.1 µm or less, lithography processes utilizing extreme ultra violet radiation (EUV) can be utilized. EUV utilizes light of wavelength about 10 to about 15 nm. The intensity and distribution of the EUV radiation applied to the resist should be controlled carefully in order to optimize the lithography process.

Ideally, the intensity and intensity distribution is monitored in the wafer plane by moving a detector or detector array into the EUV beam at the location of the wafer. However, this procedure significantly reduces the throughput of the lithography instrument. Further the beam properties would not be certain between measurements.

Figure 1:
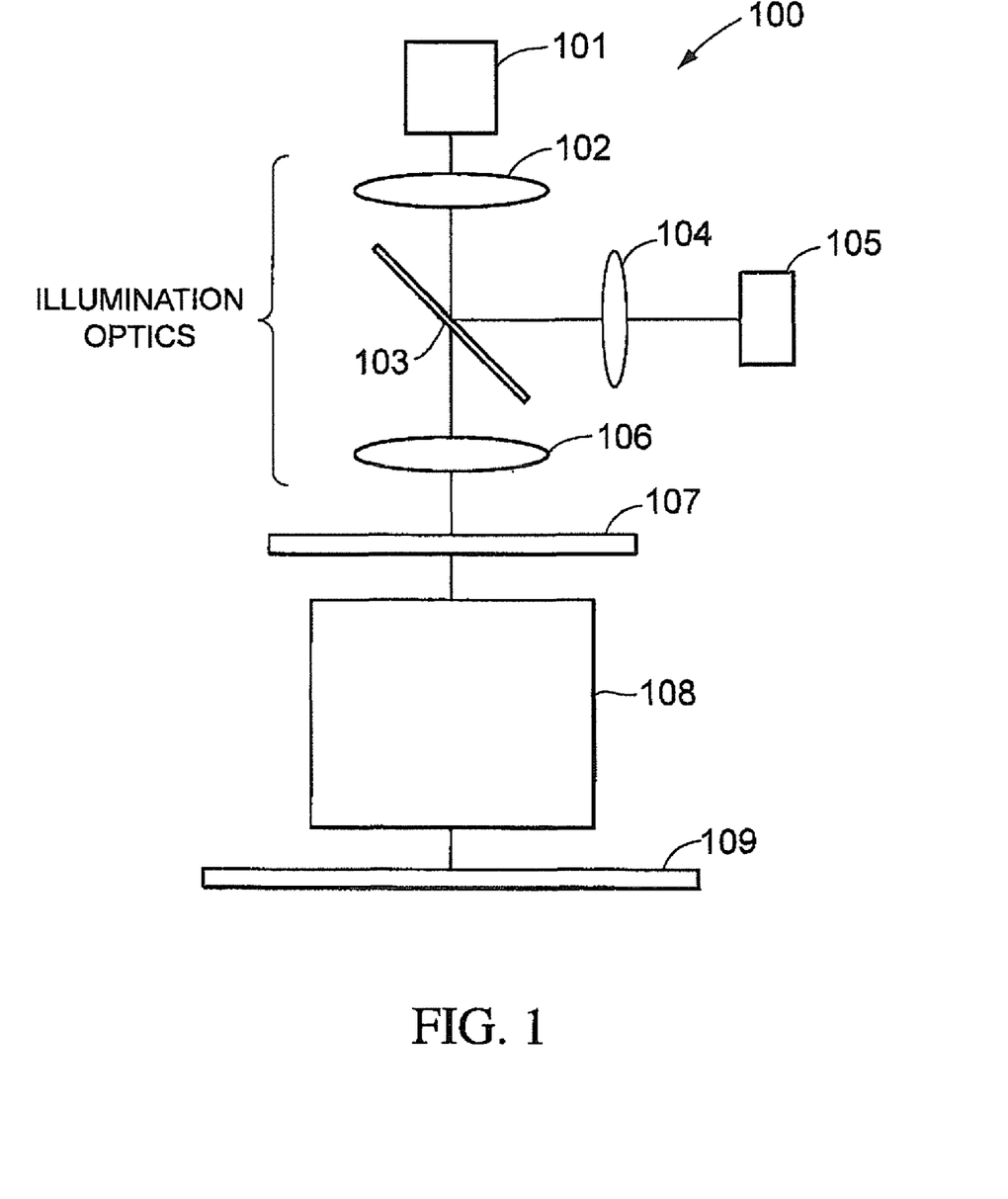
FIG. 1 illustrates a conventional lithography system.

FIG. 1 illustrates a conventional lithographic instrument 100 that measures the exposing radiation intensity in the illumination region of the lithographic instrument prior to the radiation impinging on a reticle 107. As shown in FIG. 1, a radiation source 101 provides a beam of radiation. The radiation from source 101 is focused onto reticle 107 by illumination optics. Illumination optics includes focusing lenses 102 and 106. The pattern imprinted on reticle 107 is projected onto wafer 109 by projection optics 108.

A beam splitter 103 is inserted between lens 102 and 106 in order to reflect a small fraction of the illumination onto illumination detector 105. A focusing lens 104 is inserted between beam splitter 103 and illumination detector 105 configured to focus light onto illumination detector 105. Illumination detector 105 can measure either the total illumination intensity or the illumination intensity distribution or both.

However, because EUV radiation is strongly absorbed by all materials, placing beam splitter 103 in an EUV lithography system is not possible. Additionally, EUV illumination optics consists entirely of mirrors, for precisely the same reason. In some systems, the EUV illumination has been measured near the periphery of one of the mirrors utilized to direct the EUV radiation. However, this approach does not measure the intensity of the EUV radiation near the center of the mirrors and does not measure the intensity distribution of the radiation. In another approach, the EUV radiation was measured by a detector placed on the surface of one of the mirrors or through a hole drilled through the mirror. However, this approach again only provides a single measurement of the intensity and does not provide accurately either the total illumination intensity or the intensity distribution at the reticle.

Therefore, there is a need to provide a system to better measure the EUV intensity distribution of the EUV beam in an EUV lithography system.

SUMMARY

In accordance with the invention, an EUV lithography system includes a mirror with a plurality of detectors positioned to detect the EUV intensity at a plurality of positions on the mirror.

A radiation monitoring system according to the present invention includes a plurality of detectors positioned to receive radiation from a plurality of positions on a mirror. In some embodiments, the mirror is a fly's eye mirror. In some embodiments, the plurality of detectors are mounted in a pattern on the mirror configured to measure an intensity and an intensity distribution of radiation incident on the mirror. In some embodiments, the plurality of detectors are mounted in a pattern between individual reflecting surfaces of the fly's eye mirror configured to measure an intensity and an intensity distribution of radiation incident on the mirror. In some embodiments, the plurality of detectors are positioned in a pattern behind the mirror and radiation is transmitted through holes formed in the mirror onto the plurality of detectors. In some embodiments, the plurality of detectors are positioned in a pattern behind the mirror and radiation is transmitted through holes drilled between individual reflecting surfaces of the fly's eye mirror onto the plurality of detectors. In some embodiments, facets are positioned in a pattern on the mirror so as to reflect radiation onto the plurality of detectors. In some embodiments, the mirror is a fly's eye mirror and the facets are positioned between reflective regions of the fly's eye mirror. In some embodiments, facets are positioned on a back plate and inserted through holes formed in the mirror. In some embodiments, the holes are large enough to allow for adjustment in the position of the facets.

A lithography system according to some embodiments of the present invention includes a radiation source that produces radiation; a first focusing optics to focus the radiation onto a reticle, the first focusing optics including one monitoring mirror; a second focusing optics to focus radiation from the reticle onto a substrate; a plurality of detectors coupled to receive radiation from a pattern of locations on the monitoring mirror; and a monitor coupled to the plurality of detectors and the source, the monitor adjusting the source in response to intensity levels measured by the plurality of detectors. In some embodiments, the radiation source is an extreme ultraviolet source. In some embodiments, the plurality of detectors are positioned on the pattern on the monitoring mirror. In some embodiments, the plurality of detectors are positioned behind the monitoring mirror to receive radiation that passes through holes formed in the monitoring mirror. In some embodiments, facets are positioned at the pattern on the monitoring mirror to reflect radiation to the plurality of detectors. In some embodiments, the facets are mounted on the monitoring mirror. In some embodiments, the facets are mounted on a backing plate and inserted through holes in the monitoring mirror. In some embodiments, the holes in the monitoring mirror are large enough to allow for alignment of the facets.

These and other embodiments are further described below with respect to the following figures.

BRIEF DESCRIPTION OF THE DRAWINGS

In the figures, elements having the same designation have the same or similar functions.

DESCRIPTION OF THE EMBODIMENTS

In an EUV lithography tool, the EUV intensity is accurately determined in order that the dose applied to the resist is controlled. Further, the intensity distribution is determined and controlled. In accordance with the present invention, the EUV intensity is measured at a plurality of positions on an EUV mirror positioned in the EUV beam of an EUV lithography system.

Figure 9:
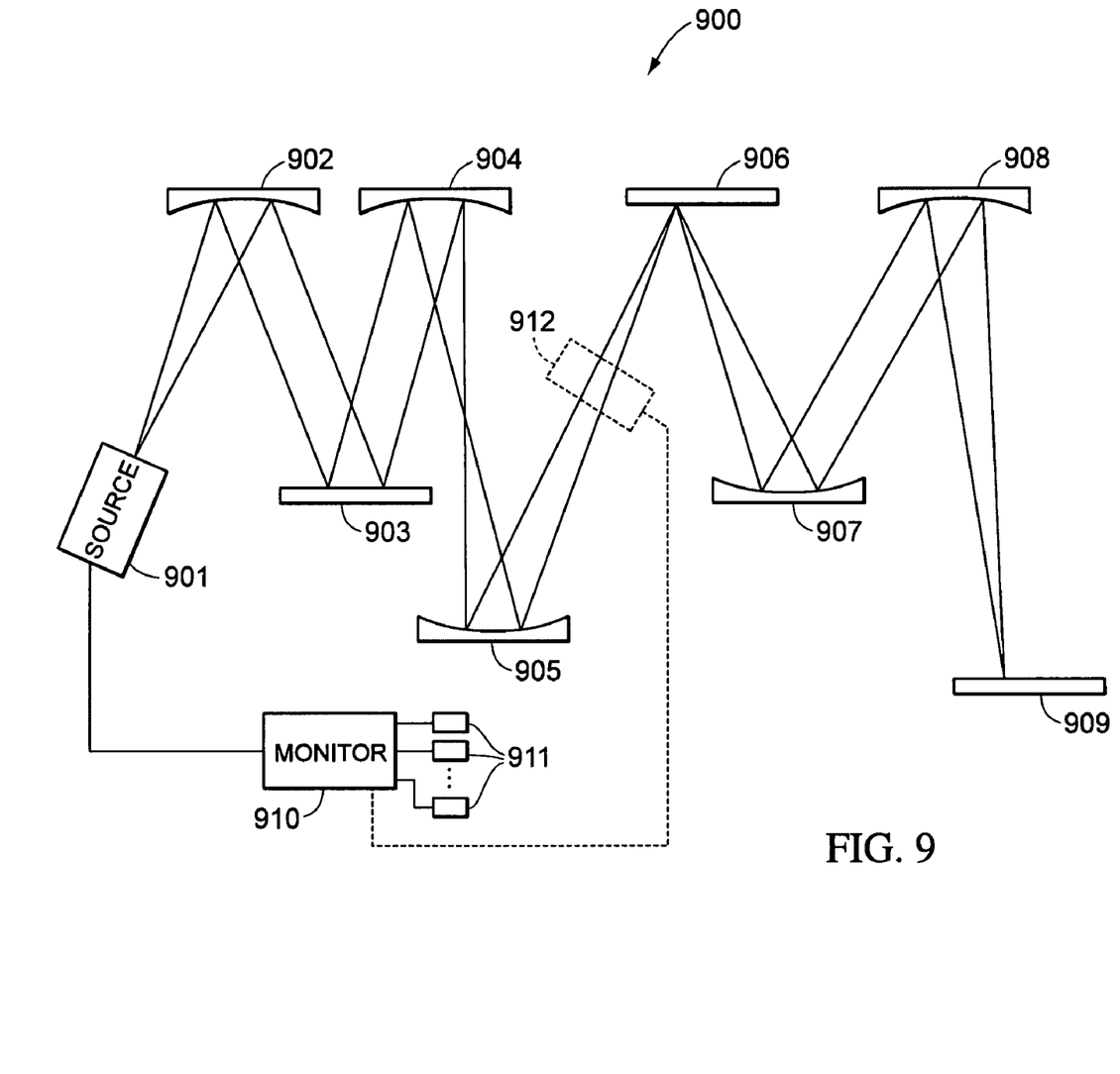
FIG. 9 illustrates an EUV lithography system according to some embodiments of the present invention.

FIG. 9 illustrates an example of an EUV lithography system 900 according to some embodiments of the present invention. A radiation source 901 produces a beam of radiation that is collimated by mirrors 902 and 903 and focused onto a reticle 906 by mirrors 904 and 905. The reflected beam from reticle 906 is focused onto a substrate 909 by mirrors 907 and 908. Substrate 909 can be any substrate on which a lithographic process is being performed, including a semiconductor wafer on which semiconductor devices are being manufactured. In some embodiments, substrate 909 includes a photoresist layer that, after being exposed to the image of reticle 906, is developed and utilized as an etch mask.

In some embodiments, a monitor 910 can control the output radiation of source 901 in response to the intensity levels measured by detectors 911. In some embodiments, monitor 910 can be coupled to a control device 912 positioned between source 901 and reticle 906 that is capable of adjusting the intensity of radiation at reticle 906. Control device 912 can be, for example, a controllable neutral density filter or other such device that can be utilized to adjust the intensity of radiation. Detectors 911 are positioned around one or more of mirrors 902, 903, 904, or 905 as discussed above in order to monitor the radiation intensity and intensity distribution of the EUV radiation beam. EUV lithography system 900 can include any number of mirrors to transfer the image formed on reticle 906 to substrate 909. The embodiment of EUV lithography system 900 is an illustrative example.

Figure 2A:
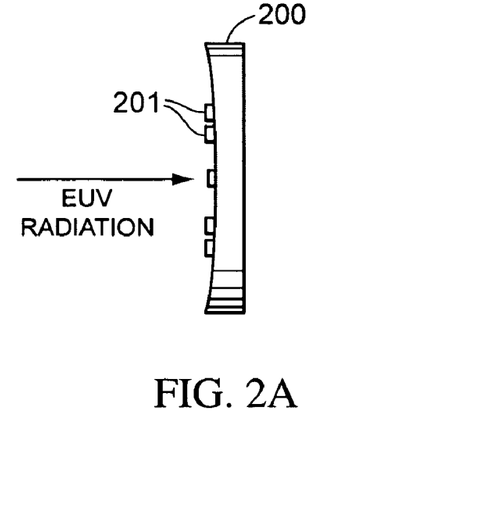
FIGS. 2A and 2B illustrate a mirror for an EUV lithography system according to some embodiments of the present invention.
Figure 2B:
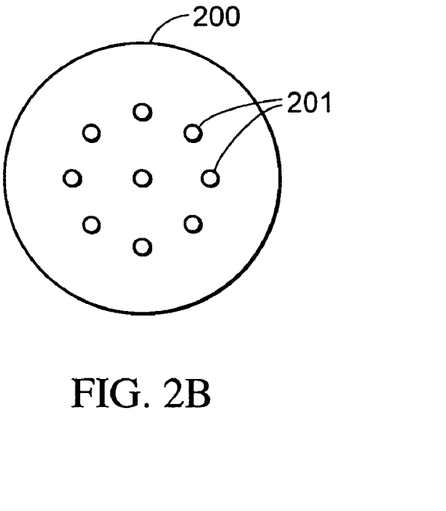

FIGS. 2A and 2B illustrate an embodiment of a monitoring system for an EUV lithography system according to some embodiments of the present invention. FIG. 2A illustrates a cross section of mirror 200 while FIG. 2B illustrates a plan view of mirror 200, which can be one of mirrors 902, 903, 904, or 905 shown in FIG. 9. As shown in FIGS. 2A and 2B, detectors 201, which can be some of detectors 911 shown in FIG. 9, are distributed around mirror 200. Any pattern of distribution of detectors 201 can be utilized.

Figure 3A:
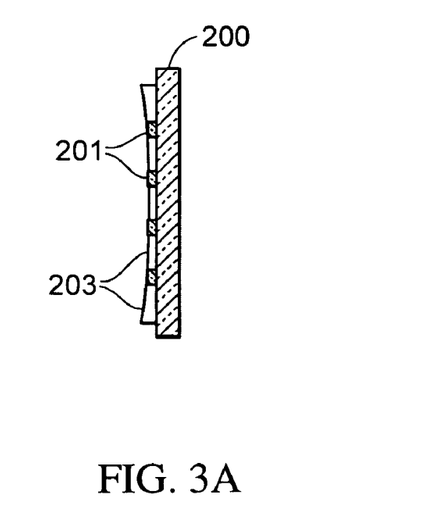
FIGS. 3A and 3B illustrate another embodiment of a mirror for an EUV lithography system according to some embodiments of the present invention.
Figure 3B:
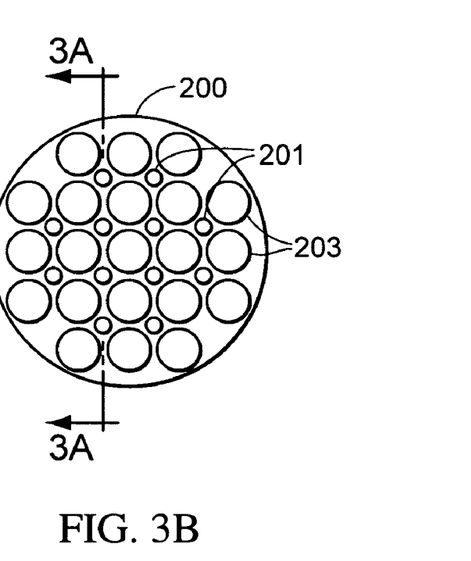

FIGS. 3A and 3B illustrate another embodiment of a monitoring system. Mirror 200 in FIGS. 3A and 3B is a Fly's eye mirror. Mirror 200 includes a plurality of individual mirrors 202 distributed on a substrate 203. Detectors 201 can be distributed between individual ones of mirrors 202.

As shown in FIGS. 2A, 2B, 3A, and 3B, EUV detectors 201 are mounted directly on mirror 200, covering a fraction of mirror 200. Detectors 201 can provide both intensity and distribution information of the EUV radiation in real time during exposure. To reduce the absorption of EUV radiation by detectors 201, detectors 201 can occupy a small fraction of the surface of mirror 200. Reduction of the absorption of EUV radiation by detectors 201 can reduce the affect on the radiation intensity at reticle 906 as a result of the presence of detectors 201 appreciably. To improve the uniformity of the intensity on reticle 906, mirror 200 can be positioned apart from a conjugate position relative to reticle 906. In which case, the dark regions associated with detectors 201 will be defocused so as to improve the overall intensity uniformity.

The EUV radiation intensity and distribution information provided by detectors 201 at mirror 200 can be used to adjust the properties of radiation source 901. It can also be used to infer the radiation conditions at reticle 906. The intensity distribution at reticle 906 is normally desired to be uniform. In addition, the angular intensity of radiation at reticle 906 should satisfy certain predetermined conditions. By comparing the measured intensity at detectors 201 with a model of source intensity and an optical model of focusing optics, which can include mirrors 902, 903, 904, and 905, information about the radiation intensity at reticle 906 can be inferred in real time. In general, detectors 911 positioned at several mirrors in difference locations within the focusing optics between source 901 and reticle 906 can be utilized to obtain complete description of the EUV intensity conditions at reticle 906 in lithographic instrument 900. As one example, detectors at mirror 905 in FIG. 9 can directly provide information about the angular distribution of the EUV radiation at reticle 906.

In the detector system shown in FIGS. 2A and 2B, because detectors 201 are mounted on mirror 200 the entire detector surface absorbs the EUV radiation, not just the active part of detector 201. This arrangement may result in greater obscuration of the surface of mirror 200 for a given number of detectors 201 than is desired. In addition, wires and other connections that need to be provided to detectors 201 are either covering more of the surface of mirror 200, or are feeding through holes to the backside of mirror 200. In addition, thermal problems arising from absorption of the radiation by detectors 201, or from heat generated internally in detectors 201, may complicate operation of mirror 200. Other embodiments of the present invention can ameliorate many of these issues.

Figure 4A:
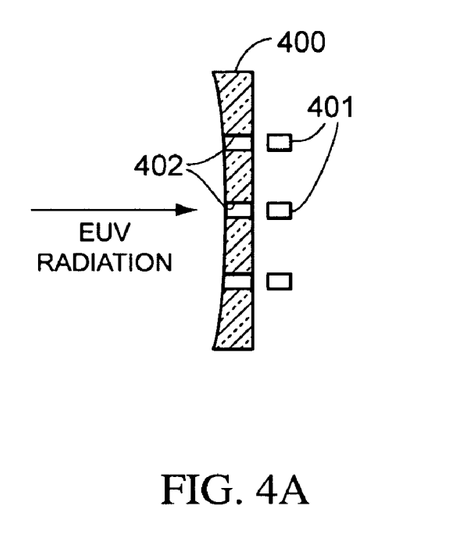
FIGS. 4A and 4B illustrate an embodiment of a radiation monitoring system according to some embodiments of the present invention.
Figure 4B:
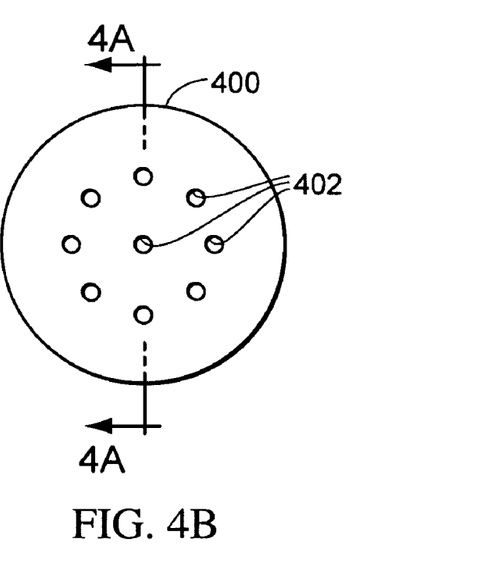

FIGS. 4A, 4B, 5A, and 5B illustrate another embodiment of an EUV intensity monitoring system according to the present invention. As shown in FIG. 4A, through holes 402 are formed in mirror 400 to allow EUV radiation to pass through mirror 400 and onto detectors 401. Detectors 401 are positioned at the back side of mirror 400 to collect and monitor the radiation passing through the mirror. As shown in FIGS. 4A and 4B, through holes 402 need only be large enough to allow radiation to pass through mirror 400 onto all or part of the active region of detectors 401. Again, although one example pattern of holes 402 is shown, holes 402 can be arranged in any pattern. The advantage of utilizing through holes 402 in mirror 400 is that only the amount of radiation that is to be diverted to detectors 401 needs to be lost.

Figure 5A:
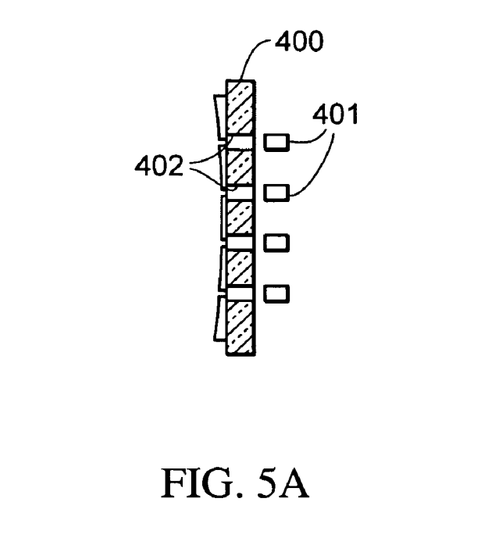
FIGS. 5A and 5B illustrate another embodiment of a radiation monitoring system according to some embodiments of the present invention.
Figure 5B:
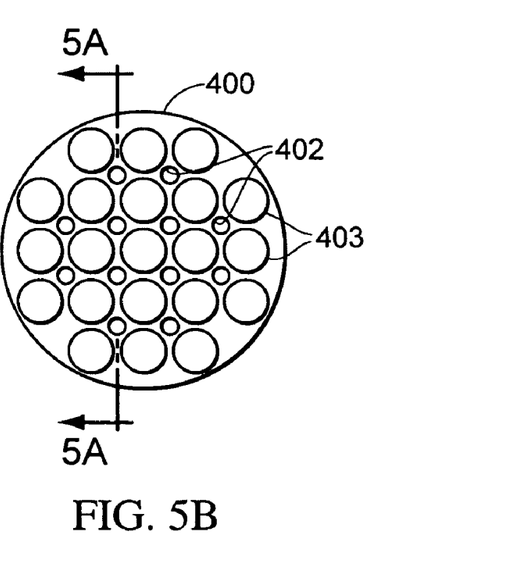

FIGS. 5A and 5B illustrate an embodiment of EUV intensity monitoring system similar to that shown in FIGS. 4A and 4B, except that a mirror 400 is a Fly's eye mirror that includes individual mirrors 403. As shown in FIG. 5B, through holes 402 can be positioned between individual mirrors 403 of mirror 402.

The embodiments of optical radiation detector shown in FIGS. 4A, 4B, 5A, and 5B, with holes 402, do not obscure as much light from mirrors 400 as may be experienced with the embodiments shown in FIGS. 2A, 2B, 3A, and 3B. Holes 402 only need to be large enough to allow light to be incident on part or all of detectors 401. The overall area of detectors 401 can be larger than holes 402 without further obstructing the radiation on mirror 400. Further, detectors 401 may be physically located at a distance from mirrors 400, and need not be mounted directly on mirrors 400, in order that thermal or mechanical problems with operation of detectors 401 can be minimized. In some embodiments, a cooling system can be provided to reduce the effects of thermal heating. In the Fly's eye embodiment shown in FIGS. 5A and 5B, holes 402 can be positioned between individual mirrors or facets 403 to further minimize the total reflection loss of mirror 400.

The source of EUV radiation that is incident on mirrors 400 of an EUV lithography system typically outputs radiation over a broad range of wavelengths outside of the EUV bandwidth. For example, if the EUV radiation is provided by a laser or discharge produced plasma, radiation extending from EUV up to infrared wavelengths may be produced. This additional radiation may complicate measurement of the EUV radiation and may damage the detectors as well.

Figure 6A:
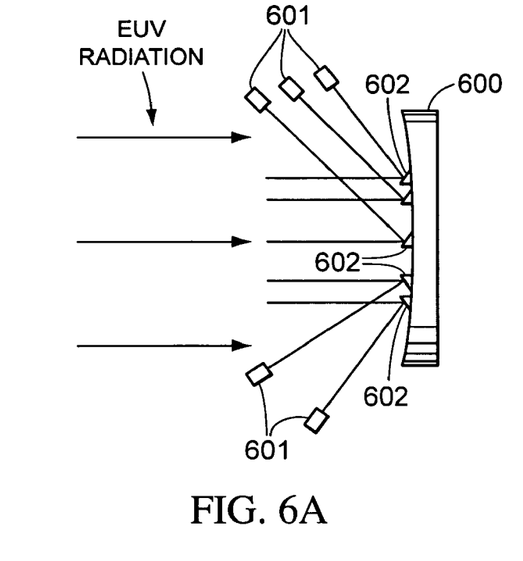
FIGS. 6A and 6B illustrate another embodiment of a radiation monitoring system according to some embodiments of the present invention.
Figure 6B:
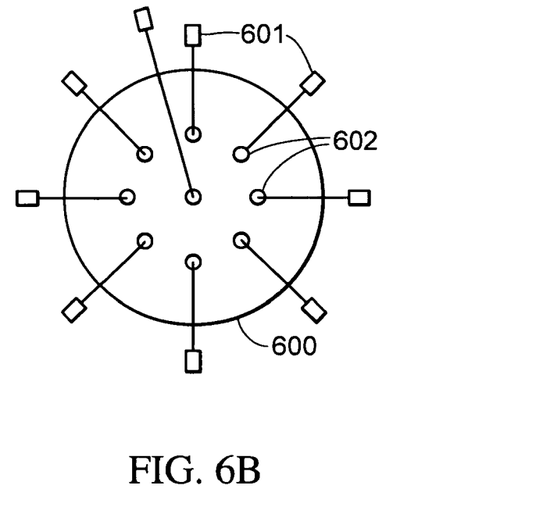

FIGS. 6A, 6B, 7A, and 7B illustrate an EUV radiation monitoring system that positions detectors 601 outside of the direct path of EUV radiation. In FIGS. 6A and 6B, small facets 602 are mounted to mirror 600 to redirect a small portion of the EUV radiation to detectors 601. Detectors 601 are distributed around mirror 600 in order to receive EUV radiation from one of the facets 602. As shown in FIGS. 6A and 6B, facets 602 only need to intercept enough EUV radiation for detectors 601 to detect. The radiation incident on detectors 601 from facets 602 may cover some or all of the active surface of detectors 601, but need not cover any of the inactive surface. In some embodiments, facets 602 can be shaped to concentrate the reflected EUV radiation onto the active area of the detector. Further, detectors 601 can be well removed from mirror 600 so that mechanical and thermal instabilities are not introduced into mirror 600. Additionally, facets 602 may reflect the EUV radiation while absorbing or transmitting radiation of other wavelengths, protecting detectors 601 from damage from such wavelengths and providing a signal representative of the relevant EUV radiation.

Figure 7A:
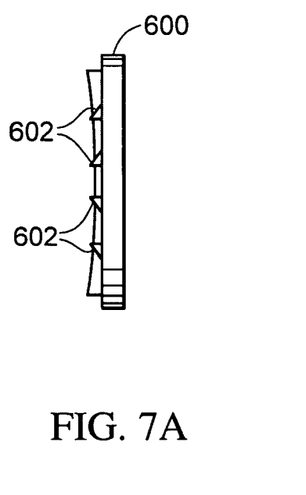
FIGS. 7A and 7B illustrate another embodiment of a radiation monitoring system according to some embodiments of the present invention.
Figure 7B:
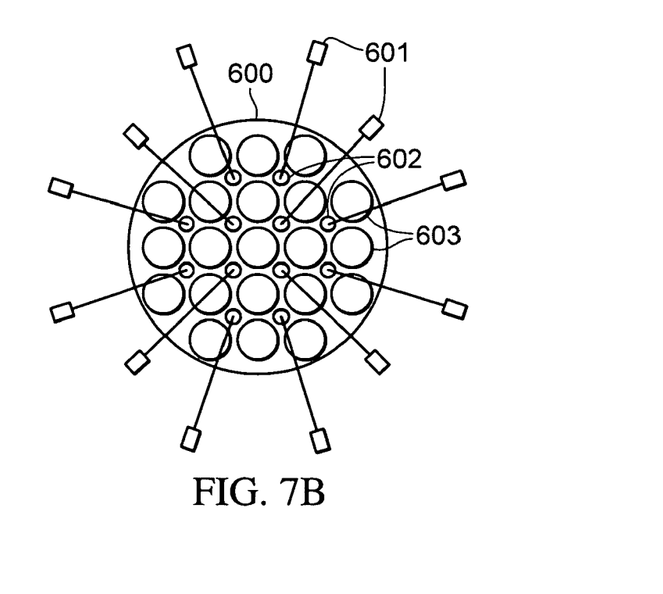

FIGS. 7A and 7B illustrate another embodiment where mirror 600 is a Fly's eye mirror. As shown in FIG. 7B, facets 602 can be positioned between individual mirror segments 603 of mirror 600.

Figure 8A:
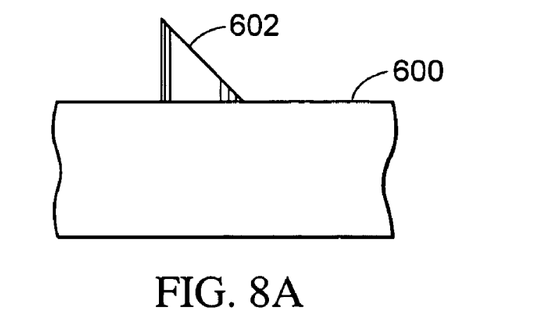
FIGS. 8A, 8B, and 8C illustrate mounting of facets on a mirror as in the embodiments illustrated in FIGS. 6A, 6B, 7A, and 7B.
Figure 8B:
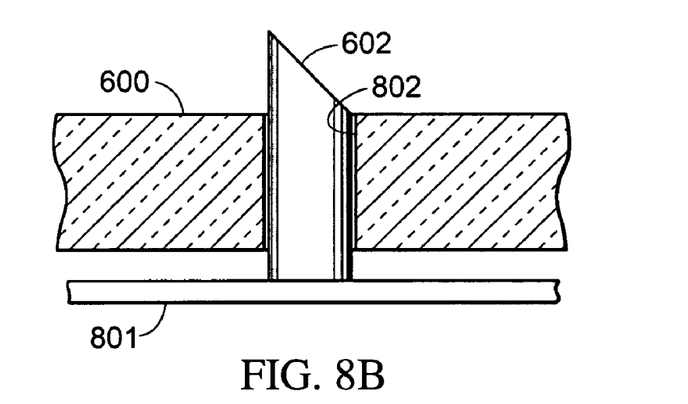
Figure 8C:
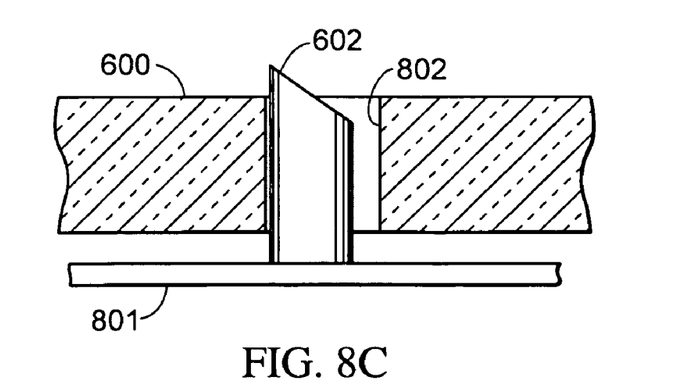

FIGS. 8A, 8B, and 8C illustrate various embodiments of facets 602. As shown in FIG. 8A, facet 602 can be mounted or formed directly on the surface of mirror 600. Facet 602 is shaped and positioned to reflect light onto a corresponding one of detectors 601. Therefore, each of facets 602 mounted on mirror 600 can have a different shape and be mounted to direct EUV radiation in a different direction.

FIG. 8B illustrates an embodiment where facet 602 is mounted on a facet base plate 801 and inserted from the backside of mirror 600 through holes 802 drilled in mirror 802. As shown in FIG. 8B, holes 802 may be only large enough to allow passage of facets 602 through hole 802. Base plate 801, with facets 602, can be formed and then inserted through and mounted to mirror 600.

As shown in FIG. 8C, hole 802 can be made large enough to allow some adjustment of facets 602. In that case, facets 602 may be inserted through hole 802 and aligned with detectors 601 by adjusting the position of base plate 801 before base plate 801 is mounted behind the back side of mirror 600.

In the embodiments discussed in this disclosure, mirrors, detectors, and facets may all include coatings of various types. Further, the output signals from detectors 201, 401, and 601 may be input to a controller for analysis. The control may then utilize the total intensity and distribution of the intensity to adjust an EUV lithography system accordingly.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A radiation monitoring system for a lithography system, comprising:
   a plurality of detectors positioned to detect radiation at a plurality of positions on a single mirror that is positioned between an illumination source providing the radiation and a reticle; and
   a control device for adjusting intensity of the radiation, the control device being positioned between the illumination source and the reticle, and being controlled by intensity levels measured by the plurality of detectors.

2. The system of claim 1, wherein the radiation is extreme ultraviolet radiation.

3. The system of claim 1, wherein the mirror is a fly's eye mirror.

4. The system of claim 1, wherein the plurality of detectors are mounted in a pattern on the mirror and configured to measure an intensity and an intensity distribution of radiation incident on the mirror.

5. The system of claim 3, wherein the plurality of detectors are mounted in a pattern between individual reflecting surfaces of the fly's eye mirror and configured to measure an intensity and an intensity distribution of radiation incident on the mirror.

6. The system of claim 1, wherein the plurality of detectors are positioned in a pattern behind the mirror and radiation is transmitted through holes formed in the mirror onto the plurality of detectors.

7. The system of claim 3, wherein the plurality of detectors are positioned in a pattern between individual reflecting surfaces of a fly's eye mirror and radiation is transmitted through holes drilled between the individual reflecting surfaces of the fly's eye mirror onto the plurality of detectors.

8. The system of claim 1, wherein facets are positioned in a pattern on the mirror so as to reflect radiation onto the plurality of detectors.

9. The system of claim 8, wherein the mirror is a fly's eye mirror and the facets are positioned between reflective regions of the fly's eye mirror.

10. The system of claim 8, wherein facets are positioned on a back plate and inserted through holes formed in the mirror.

11. The system of claim 10, wherein the holes are large enough to allow for adjustment in the position of the facets.

12. The system of claim 1, wherein the plurality of detectors on the single mirror are located to receive light from positions on more than one mirror positioned between the illumination source and the reticle.

13. A lithography system, comprising:
   a radiation source that produces radiation;
   a first optics to illuminate the radiation onto a first surface, the first optics including at least one monitoring mirror;
   a second optics to direct radiation from the first surface onto a second surface; and a plurality of detectors coupled to receive radiation from a pattern of locations on the at least one monitoring mirror; and a control device for adjusting intensity of the radiation, the control device being positioned between the illumination source and the reticle, and being controlled by intensity levels measured by the plurality of detectors.

14. The system of claim 13, wherein the radiation source is an extreme ultraviolet source.

15. The system of claim 13, wherein the plurality of detectors are positioned on the pattern on the at least one monitoring mirror.

16. The system of claim 13, wherein the plurality of detectors are positioned behind the at least one monitoring mirror to receive radiation that passes through holes formed in the at least one monitoring mirror.

17. The system of claim 13, further including facets positioned at the pattern on the at least one monitoring mirror to reflect radiation to the plurality of detectors.

18. The system of claim 17, wherein the facets are mounted on the at least one monitoring mirror.

19. The system of claim 17, wherein the facets are mounted on a backing plate and inserted through holes in the at least one monitoring mirror.

20. The system of claim 19, wherein the holes in the at least one monitoring mirror are large enough to allow for alignment of the facets.

21. The system of claim 13, wherein the at least one monitoring mirror includes a plurality of monitoring mirrors.

22. The system of claim 13, wherein the first surface is a reticle and the second surface is a substrate.

23. The system of claim 13, further including a monitor which is coupled to the source to adjust radiation intensity from the source in response to intensity levels measured by the plurality of detectors.

24. The system of claim 13, further including a monitor which is coupled to a control device to adjust radiation intensity on the first surface in response to intensity levels measured by the plurality of detectors.

25. A method of processing a substrate, comprising:
illuminating a reticle with radiation through a first optics, the first optics including at least one monitoring mirror;
directing the radiation from the reticle to the substrate through a second optics; and
monitoring the radiation by a plurality of detectors at the at least one monitoring mirror; and
controlling by a control device, the radiation according to radiation levels measured by the at least one monitoring mirror.

26. The method of claim 25, wherein illuminating a reticle with radiation includes illuminating the reticle with extreme ultraviolet radiation.

27. The method of claim 25, wherein monitoring the radiation at the at least one monitoring mirror includes receiving signals from the plurality of detectors positioned to receive radiation at a pattern of positions on the at least one monitoring mirror.

28. The method of claim 27, wherein the plurality of detectors are mounted in a pattern on the at least one monitoring mirror and configured to measure an intensity and an intensity distribution of radiation incident on the at least one monitoring mirror.

29. The method of claim 27, wherein at least one of the monitoring mirrors is a fly's eye mirror and the plurality of detectors are mounted in a pattern between individual reflecting surfaces of the fly's eye mirror and configured to measure an intensity and an intensity distribution of radiation incident on the mirror.

30. The method of claim 27, wherein the plurality of detectors are positioned in a pattern behind the at least one monitoring mirror and the radiation is transmitted through holes formed in the at least one monitoring mirror onto the plurality of detectors.

31. The method of claim 27, wherein at least one of the monitoring mirrors is a fly's eye mirror and the plurality of detectors are positioned in a pattern behind the fly's eye mirror and configured such that radiation is transmitted through holes drilled between the individual reflecting surfaces of the fly's eye mirror onto the plurality of detectors.

32. The method of claim 27, wherein at least one of the monitoring mirrors includes facets positioned in a pattern on the mirror configured to reflect radiation onto the plurality of detectors.

33. The method of claim 32, where the at least one of the monitoring mirrors is a fly's eye mirror and the facets are positioned in a pattern between reflecting surfaces of the fly's eye mirror and configured to reflect radiation onto the plurality of detectors.

34. The method of claim 32, where at least one of the monitoring mirrors includes facets positioned on a back plate and inserted through holes formed in the mirror.

35. The method of claim 34 wherein the holes are large enough to allow for adjustment in the position of the facets.

* * * * *